(12) United States Patent
Manassen et al.

(10) Patent No.: US 9,123,649 B1
(45) Date of Patent: Sep. 1, 2015

(54) FIT-TO-PITCH OVERLAY MEASUREMENT TARGETS

(71) Applicant: KLA-Tencor Corporation, Milpitas, CA (US)

(72) Inventors: Amnon Manassen, Haifa (IL); Barry Loevsky, Yokneam Illit (IL)

(73) Assignee: KLA-Tencor Corporation, Milpitas, CA (US)

( * ) Notice: Subject to any disclaimer, the term of this patent is extended or adjusted under 35 U.S.C. 154(b) by 0 days.

(21) Appl. No.: 14/160,154

(22) Filed: Jan. 21, 2014

Related U.S. Application Data

(60) Provisional application No. 61/754,755, filed on Jan. 21, 2013.

(51) Int. Cl.
*G06K 9/00* (2006.01)
*H01L 21/66* (2006.01)
*G06T 7/00* (2006.01)

(52) U.S. Cl.
CPC .............. *H01L 22/30* (2013.01); *G06T 7/0004* (2013.01); *G06K 9/00* (2013.01)

(58) Field of Classification Search
CPC . G03F 9/7084; G03F 7/70633; G03F 9/7076; G03F 7/0002; G03F 7/7065; G03F 7/70625; G03F 1/144; G03F 9/70; G03F 9/7088; G06T 2207/30148; G06T 7/0028; H01L 23/544; H01L 23/585; H01L 21/0337; G01N 21/956; G01N 21/9501
USPC ................. 382/103, 141, 144, 145, 149, 151; 356/237, 364, 399, 401; 430/5, 22, 430/311, 394
See application file for complete search history.

(56) References Cited

U.S. PATENT DOCUMENTS

| | | | |
|---|---|---|---|
| 4,643,579 A | | 2/1987 | Toriumi et al. |
| 5,086,477 A | * | 2/1992 | Yu et al. .................... 382/145 |
| 5,151,750 A | * | 9/1992 | Magome et al. .............. 356/401 |
| 5,583,609 A | * | 12/1996 | Mizutani et al. ................ 355/46 |
| 5,712,707 A | | 1/1998 | Ausschnitt et al. |
| 5,723,236 A | * | 3/1998 | Inoue et al. ........................ 430/5 |
| 5,753,416 A | * | 5/1998 | Okamoto et al. ............. 430/311 |
| 5,965,307 A | * | 10/1999 | Miyatake ......................... 430/22 |
| 6,150,231 A | | 11/2000 | Muller et al. |
| 6,301,798 B1 | | 10/2001 | Liu et al. |

(Continued)

FOREIGN PATENT DOCUMENTS

| | | |
|---|---|---|
| KR | 2003053224 A | 6/2003 |
| KR | 2006019761 A | 3/2006 |
| WO | 2013132064 A2 | 9/2013 |

*Primary Examiner* — Vu Le
*Assistant Examiner* — Aklilu Woldemariam
(74) *Attorney, Agent, or Firm* — Suiter Swantz pc llo

(57) ABSTRACT

Various target configurations are disclosed. A target may include multiple lines spaced equally apart according to a pitch distance. The target may also include a first mark having at least one edge parallel to the lines, wherein the edge is configured to have at least one of: a periodically repetitive edge pattern having an amplitude that is a multiple of the pitch, a length that is a multiple of the pitch, or a thickness that is a multiple of the pitch. The target may further include a second mark having at least one edge parallel to the plurality of lines, wherein the edge is configured to have at least one of: a periodically repetitive edge pattern having a second amplitude that is a multiple of the pitch, a length that is a multiple of the pitch, or a thickness that is a multiple of the pitch.

20 Claims, 3 Drawing Sheets

(56) References Cited

U.S. PATENT DOCUMENTS

| | | |
|---|---|---|
| 6,538,740 B1* | 3/2003 | Shiraishi et al. ............ 356/401 |
| 6,660,462 B1* | 12/2003 | Fukuda ..................... 430/394 |
| 6,730,444 B2* | 5/2004 | Bowes ......................... 430/5 |
| 6,788,393 B2* | 9/2004 | Inoue ......................... 355/72 |
| 6,836,560 B2* | 12/2004 | Emery ...................... 382/145 |
| 7,180,593 B2 | 2/2007 | Lin |
| 7,440,105 B2 | 10/2008 | Adel et al. |
| 7,528,941 B2 | 5/2009 | Kandel et al. |
| 7,626,702 B2 | 12/2009 | Ausschnitt et al. |
| 7,629,697 B2* | 12/2009 | Van Haren et al. ......... 257/797 |
| 7,751,046 B2 | 7/2010 | Levy et al. |
| 7,847,939 B2 | 12/2010 | Smith et al. |
| 8,441,639 B2 | 5/2013 | Kandel et al. |
| 8,681,413 B2 | 3/2014 | Manassen et al. |
| 2001/0007498 A1 | 7/2001 | Arai et al. |
| 2002/0041377 A1* | 4/2002 | Hagiwara et al. .......... 356/399 |
| 2002/0158193 A1* | 10/2002 | Sezginer et al. ........ 250/237 G |
| 2003/0021465 A1* | 1/2003 | Adel et al. ................. 382/151 |
| 2003/0223630 A1* | 12/2003 | Adel et al. ................. 382/145 |
| 2004/0040003 A1 | 2/2004 | Seligson et al. |
| 2004/0233439 A1* | 11/2004 | Mieher et al. ............. 356/401 |
| 2005/0140986 A1 | 6/2005 | Butler |
| 2005/0195398 A1* | 9/2005 | Adel et al. ................. 356/401 |
| 2005/0272221 A1 | 12/2005 | Yen et al. |
| 2006/0210893 A1* | 9/2006 | Van Bilsen ................... 430/30 |
| 2007/0058169 A1* | 3/2007 | Ausschnitt et al. .......... 356/401 |
| 2007/0279630 A1* | 12/2007 | Kandel et al. ............. 356/401 |
| 2008/0094639 A1* | 4/2008 | Widmann et al. ......... 356/601 |
| 2008/0112609 A1* | 5/2008 | Inoue ....................... 382/151 |
| 2009/0001615 A1 | 1/2009 | Li et al. |
| 2009/0220872 A1* | 9/2009 | Oishi ........................... 430/30 |
| 2009/0243095 A1* | 10/2009 | Fujita et al. ................. 257/737 |
| 2010/0052191 A1* | 3/2010 | Trogisch et al. ............ 257/797 |
| 2011/0076789 A1* | 3/2011 | Kuroda ......................... 438/14 |
| 2012/0146159 A1* | 6/2012 | Wang et al. ................. 257/410 |
| 2012/0206729 A1 | 8/2012 | Seligson et al. |
| 2013/0083306 A1 | 4/2013 | Smirnov et al. |
| 2013/0271740 A1 | 10/2013 | Quintanilha |
| 2014/0065832 A1* | 3/2014 | Hsieh et al. ................. 438/703 |

* cited by examiner

FIT-TO-PITCH OVERLAY MEASUREMENT TARGETS

CROSS-REFERENCE TO RELATED APPLICATIONS

The present application claims the benefit under 35 U.S.C. §119(e) of U.S. Provisional Application Ser. No. 61/754,755, filed Jan. 21, 2013. Said U.S. Provisional Application Ser. No. 61/754,755 is hereby incorporated by reference in its entirety.

TECHNICAL FIELD

The disclosure generally relates to the field of semiconductor fabrication, particularly to configurations of overlay measurement targets used for semiconductor device fabrication.

BACKGROUND

Thin polished plates such as silicon wafers and the like are a very important part of modern technology. A wafer, for instance, refers to a thin slice of semiconductor material used in the fabrication of integrated circuits and other devices. Other examples of thin polished plates may include magnetic disc substrates, gauge blocks and the like. Modern semiconductor devices are typically fabricated from layers of semiconductor, conductor or isolator material printed on wafers using photolithography techniques. Precise positioning and alignment during semiconductor fabrication is of critical importance.

SUMMARY

The present disclosure is directed to a measurement target for a semiconductor device. The measurement target includes a plurality of lines spaced equally apart from each other according to a pre-determined pitch distance. The measurement target also includes a first box mark defined by four edges, each of the four edges of the first box mark having a length that is a multiple of the pitch distance, and each of the four edges of the first box mark having a thickness that is a multiple of the pitch distance. The measurement target further includes a second box mark defined by four edges, each of the four edges of the second box mark having a length that is a multiple of the pitch distance, and each of the four edges of the second box mark having a thickness that is a multiple of the pitch distance, wherein the second box mark is defined within the first box mark.

A further embodiment of the present disclosure is also directed to a measurement target for a semiconductor device. The measurement target includes a plurality of lines spaced equally apart from each other according to a pre-determined pitch distance. The measurement target also includes a first mark defined by at least one edge parallel to the plurality of lines, the at least one edge of the first mark being configured to have a first periodically repetitive edge pattern, the first periodically repetitive edge pattern having a first amplitude that is a multiple of the pitch distance. The measurement target further includes a second mark defined by at least one edge parallel to the plurality of lines, the at least one edge of the second mark being configured to have a second periodically repetitive edge pattern, the second periodically repetitive edge pattern having a second amplitude that is a multiple of the pitch distance.

Furthermore, the present disclosure is also directed to a metrology system. The metrology system includes an imaging device configured for obtaining an image of a semiconductor device. The metrology system further includes a processor configured for identifying at least one metrology target from the image of the semiconductor device, wherein the at least one metrology target comprises: a plurality of lines spaced equally apart from each other according to a pre-determined pitch distance; a first mark and a second mark. The first mark is defined by at least one edge parallel to the plurality of lines, the at least one edge of the first mark being configured to have at least one of: a periodically repetitive edge pattern having a first amplitude that is a multiple of the pitch distance, a length that is a multiple of the pitch distance, or a thickness that is a multiple of the pitch distance. The second mark is also defined by at least one edge parallel to the plurality of lines, the at least one edge of the second mark being configured to have at least one of: a periodically repetitive edge pattern having a second amplitude that is a multiple of the pitch distance, a length that is a multiple of the pitch distance, or a thickness that is a multiple of the pitch distance. The processor is further configured for measuring target overlay of the semiconductor device based on alignment of the first mark and the second mark.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Lithographic metrology and in particular, overlay measurements, employ overlay measurement targets to facilitate precise positioning and alignment of various layers during semiconductor fabrication processes. Overlay target marks or patterns are typically printed on the different layers and are resolved in microscopes using visible light. Misalignment between such marks or patterns may be detected and measured.

Several methods are available for measuring overlay targets with imaging systems. For example, in a method referred to as box-in-box (or BIB), the target is composed of two rectangles, originating from different process layers and designed to have a common center of symmetry. The measured deviation of the two layers centers is the overlay. In another example referred to as advanced imaging metrology (or AIM), grids representing the different layers are placed in X and Y directions having zero spatial phase between them. The measured spatial phase represents the actual overlay between the layers. In still another exemplary method referred to as advanced imaging metrology intrafield (or AIMID), the search for layers centers is performed by a two-dimensional (2D) correlation in which the target is rotated and shifted for maximum overlap.

Figure 1:
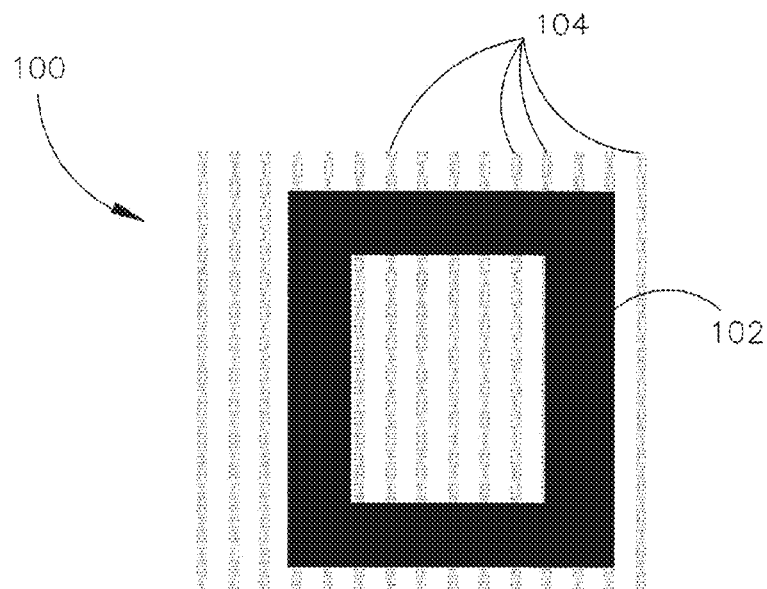
FIG. 1 is an illustration depicting a measurement target.

Referring to FIG. 1, an illustration depicting a measurement target 100 is shown. It is now common for a measurement target 100 to include both resolved features 102 and unresolved features 104. The unresolved features 104 (e.g., shown as vertical lines in this example) are grouped closely together and are too small to be individually resolved optically by the microscopes. Adding unresolved features (may also be referred to as segmentations) 104 to resolved features 102 improves mechanical and process robustness and helps the target 100 to better resemble the device.

It is noted, however, that since overlay marks consume real estate available on each layer, it is therefore desirable to reduce the size of such marks. Consequently, the considerable size difference between the overlay marks and the actual device is a source for different measurement errors. For instance, optical crosstalk between segmentations may severely impact the measurement accuracy. It is therefore desirable to design overlay measurement targets to reduce optical crosstalk between segmentations and to improve measurement accuracy.

In accordance with embodiments of the present disclosure, the pitch of the unresolved segmentation 104 is utilized as one of the design rules. Although the segmentation 104 itself is not resolved optically by the microscopes, it has a pronounced effect on the measurement of the resolved targets 102 due to the highly sensitive edge detection nature of existing imaging overlay measurement algorithms. It is contemplated that the high sensitivity level of these edge detection algorithms can be effectively harnessed for metrology of unresolved features via their effect on the measurement of resolved features, especially when the design of the measurement target is optimized for this purpose.

Figure 2:
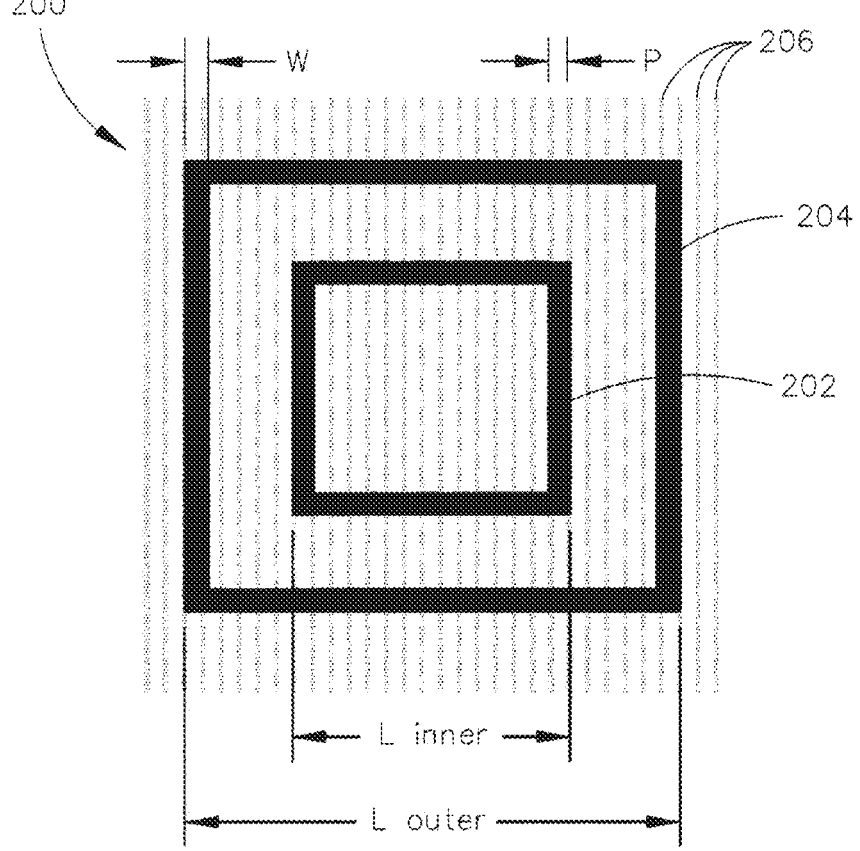
FIG. 2 is an illustration depicting a box-in-box measurement target.

Referring to FIG. 2, an illustration depicting a fit-to-pitch measurement target 200 configured in accordance with one embodiment of the present disclosure is shown. As shown in the figure, the measurement target 200 is a box-in-box target having two rectangles 202 and 204. As with conventional box-in-box targets, one of the rectangles may be positioned on one wafer layer while the other rectangles is positioned on a different layer. Therefore, FIG. 2 is an illustration depicting the box-in-box target 200 when the two layers are stacked together.

For illustrative purposes, let $L_{inner}$ denote the length of the inner box 202, $L_{outer}$ denote the length of the outer box 204, and W denote the width (or thickness) of the side edges of the boxes. Furthermore, let P denote the pitch of the unresolved segmentation 206, wherein the pitch is defined as the length of one segmentation period, as depicted in the figure.

In accordance with one embodiment of the present disclosure, if the inner and the outer boxes are segmented or laying over segmentation, then $L_{inner}$, $L_{outer}$ and W are configured to be multiples of the relevant pitch P. Mathematically:

$$\begin{cases} L_{inner} = m \times P \\ L_{outer} = n \times P \\ W = k \times P \end{cases}$$

Wherein m, n and k are integers greater than or equal to 1.

In other words, according to this design rule, the length of each edge of the rectangles and the thickness of such edges are configured to be multiples of the relevant pitch P. It has been observed that measurement accuracies have been greatly improved using this design rule.

While the boxes depicted in the example above are configured as square boxes, it is contemplated that such boxes are not limited to squares. For instance, rectangular boxes may also be utilized without departing from the spirit and scope of the present disclosure. In such cases, lengths of both the longer and the shorter edges of a rectangular box can be configured as multiples of the relevant pitch P.

It is also contemplated that the box-in-box design rule described above is not limited to two boxes. The same design rule, i.e., both the length and the thickness of the edges being multiples of the pitch, is applicable to measurement targets that utilize more than two boxes without departing from the spirit and scope of the present disclosure.

It is noted that while the design rule described above improves measurement accuracies and should be applied when possible, there are situations where applying this rule is not practical. For instance, if the target is multilayered with segmentations having different pitches optically viable in the target, the design rule described above may not need to be applied. In such cases, various fit-to-pitch edge designs in accordance with the present disclosure may be utilized instead.

Figure 3:
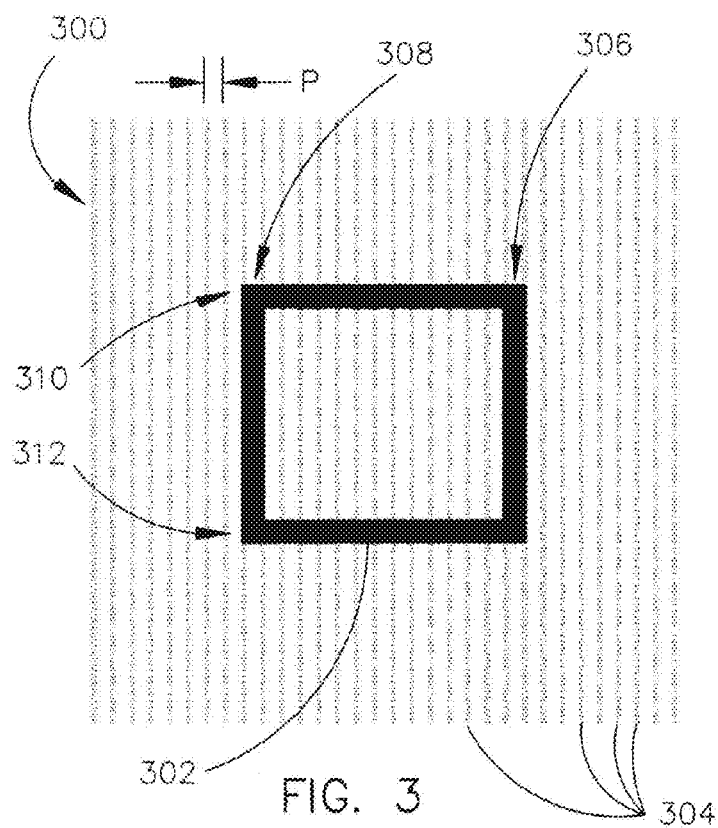
FIG. 3 is an illustration depicting a measurement target having fit-to-pitch edge configurations.
Figure 4:
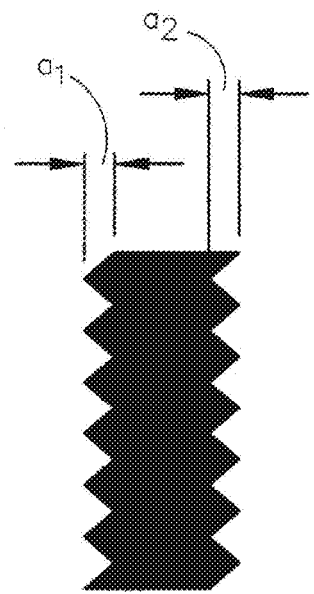
FIG. 4 is an illustration depicting the details of the fit-to-pitch edge configurations of FIG. 3.

Referring generally to FIGS. 3 and 4, illustrations depicting fit-to-pitch edge designs in accordance with various embodiments of the present disclosure is shown. As depicted in FIG. 3, the measurement target 300 includes both resolved features 302 and unresolved features 304. In this example, edges 306 and 308 of the resolved features 302 are parallel to the lines in the unresolved features 304 and edges 310 and 312 of the resolved features 302 are not. In accordance with embodiments of the present disclosure, at least the edges 306 and 308 are configured to have periodically repetitive patterns such as the zigzag patterns depicted in FIG. 4. More specifically, the amplitudes of the zigzag patterns, denoted as $a_1$ and $a_2$, are configured to be multiples of the pitch P of the unresolved features 304. Mathematically:

$$\begin{cases} a_1 = r \times P \\ a_2 = t \times P \end{cases}$$

Wherein r and t are integers greater than or equal to 1. It is noted that while r and t may be configured to be equal, this is not a requirement, and $a_1$ may differ from $a_2$ as long as they each remain multiples of P.

Figure 5:
FIG. 5 is an illustration depicting an alternative fit-to-pitch edge configuration.
Figure 6:
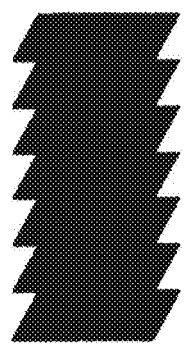
FIG. 6 is another illustration depicting an alternative fit-to-pitch edge configuration.
Figure 7:
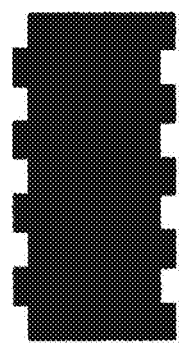
FIG. 7 is still another illustration depicting an alternative fit-to-pitch edge configuration.

It is contemplated that periodically repetitive patterns suitable for the edges are not limited to zigzag patterns. As illustrated in FIGS. 5 through 7, various other periodically repetitive patterns including, but not limited to, shapes such as sine, triangle, rectangular, square or the like may also be utilized without departing from spirit and scope of the present disclosure. Preferably, the amplitude of that particular periodically repetitive pattern should be a multiple of $P_{max}$ (i.e., the size of the longest pitch when segmentations having different pitches are optically viable in the target), and the repetition rate of the edge should not be a multiple of the pitch P.

In addition, it is noted that only the edges that are parallel to the unresolved features 304 (i.e., edges 306 and 308 in this example) are required to have such periodically repetitive edge patterns according to this design rule. Edges that are perpendicular to the unresolved features 304 may be optionally configured to have periodically repetitive edge patterns as well. However, the perpendicular edges may stay straight.

Furthermore, while the illustration depicted in FIG. 3 shows the resolved features 302 forming a box, this configuration is merely exemplary. That is, the fit-to-pitch edge pattern design rule described above may be applicable to various other shapes/types of measurement targets without departing from the spirit and scope of the present disclosure.

It is noted that the two design rules described above, i.e., 1) configuring the length and thickness of the edges to be multiples of the relevant pitch; and 2) configuring the edges to have periodically repetitive patterns having an amplitude that is a multiple of the pitch, both take into consideration the pitch of the segmentation in the target, and hence they are referred to as fit-to-pitch design rules in the present disclosure. It is contemplated that the two designs rules may be implemented independently or jointly within the same measurement target. It is understood that the specific implementations may vary based on specific devices being fabricated.

It is contemplated that the term measurement target may be used to jointly refer to the stacked overlay marks from two or more layers. It is understood that if a particular measurement target implements the design rules described above, it is implied that the overlay marks printed on different layers must also implement the applicable rules accordingly. Therefore, it is understood that the design rules in accordance with the present disclosure is applicable to measurement targets as well as overlay marks, and the term "target" and the term "mark" may be interpreted interchangeably.

Figure 8:
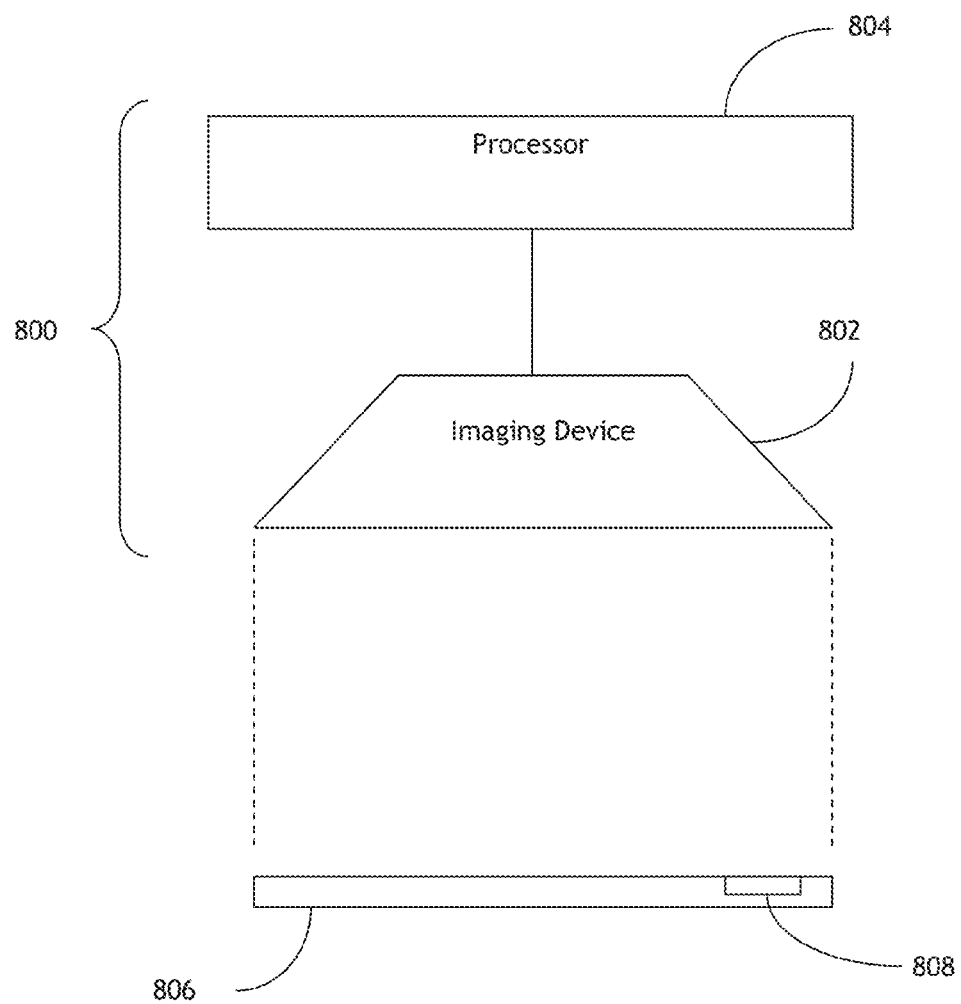
FIG. 8 is a block diagram depicting a metrology system.

Referring now to FIG. 8, a block diagram depicting a metrology system 800 capable of performing metrology of lithography process using image processing techniques is shown. The metrology system 800 may include an imaging devices (e.g., a scanner, a microscope or the like) 802 configured for obtaining images of a semiconductor device 806 (e.g., a wafer). For instance, the imaging device 802 may capture an aerial image (e.g., top views) of the semiconductor device 806 and provide the image to a processor 804 configured for processing the obtained image. It is contemplated that the metrology system 800 may include more than one imaging device without departing from the spirit and scope of the present disclosure. Certain metrology systems may provide the abilities to capture both sides of the semiconductor device simultaneously.

The processor 804 may be implemented utilizing any standalone or embedded computing device (e.g., a computer, a processing unit/circuitry or the like). Upon receiving the image from the imaging device 802, the processor 804 may identify one or more targets 808 present on the wafer 806 and carry out the various measurement processes described above. More specifically, the targets 808 being processed are configured in accordance with the design rules described above.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. A measurement target for a semiconductor device, the measurement target comprising:
   a plurality of lines spaced equally apart from each other according to a pre-determined pitch distance;
   a first box mark defined by four edges, at least one of the four edges of the first box mark having a length that is a multiple of the pre-determined pitch distance of the plurality of lines, and at least one of the four edges of the first box mark having a thickness that is a multiple of the pre-determined pitch distance of the plurality of lines; and
   a second box mark defined by four edges, at least one of the four edges of the second box mark having a length that is a multiple of the pre-determined pitch distance of the plurality of lines, and at least one of the four edges of the second box mark having a thickness that is a multiple of the pre-determined pitch distance of the plurality of lines, wherein the second box mark is defined within the first box mark.

2. The measurement target of claim 1, wherein the measurement target is formed by at least two overlay marks from at least two layers of the semiconductor device, and wherein the first box mark and the second box mark at least partially overlap with the plurality of lines.

3. The measurement target of claim 1, wherein the lengths of the four edges of the first box mark are substantially identical and the lengths of the four edges of the second box mark are substantially identical.

4. The measurement target of claim 1, wherein the plurality of lines spaced equally apart from each other forms an unresolved feature.

5. The measurement target of claim 1, wherein two edges defining the first box mark are perpendicular to the plurality of lines and two edges defining the first box mark are parallel to the plurality of lines, and wherein two edges defining the second box mark are perpendicular to the plurality of lines and two edges defining the second box mark are parallel to the plurality of lines.

6. The measurement target of claim 5, wherein at least the two edges defining the first box mark that are parallel to the plurality of lines and at least the two edges defining the second box mark that are parallel to the plurality of lines are configured to have periodically repetitive edge patterns, each periodically repetitive edge pattern having an amplitude that is a multiple of the pitch distance.

7. The measurement target of claim 6, wherein the periodically repetitive patterns include at least one of: a sine pattern, a triangular pattern, or a rectangular pattern.

8. A measurement target for a semiconductor device, the measurement target comprising:
   a plurality of lines spaced equally apart from each other according to a pre-determined pitch distance;
   a first mark defined by at least one edge parallel to the plurality of lines, the at least one edge of the first mark being configured to have a first periodically repetitive edge pattern, the first periodically repetitive edge pattern having a first amplitude that is a multiple of the pre-determined pitch distance of the plurality of lines; and a second mark defined by at least one edge parallel to the plurality of lines, the at least one edge of the second mark being configured to have a second periodically repetitive edge pattern, the second periodically repetitive edge pattern having a second amplitude that is a multiple of the pre-determined pitch distance of the plurality of lines.

9. The measurement target of claim 8, wherein the first mark is positioned on one layer of the semiconductor device and the second mark is positioned on another layer of the semiconductor device, and wherein the first mark and the second mark at least partially overlap with the plurality of lines.

10. The measurement target of claim 8, wherein the first periodically repetitive edge pattern and the second periodically repetitive edge pattern are identical.

11. The measurement target of claim 8, wherein the periodically repetitive patterns include at least one of: a sine pattern, a triangular pattern, or a rectangular pattern.

12. The measurement target of claim 8, wherein the first mark is a box mark defined by four edges, each of the four edges of the first mark having a length that is a multiple of the pitch distance, and each of the four edges of the first mark having a thickness that is a multiple of the pitch distance.

13. The measurement target of claim 12, wherein the second mark is a box mark defined by four edges, each of the four edges of the second mark having a length that is a multiple of the pitch distance, and each of the four edges of the second mark having a thickness that is a multiple of the pitch distance, wherein the second mark is defined within the first mark.

14. The measurement target of claim 13, wherein the lengths of the four edges of the first mark are substantially identical and the lengths of the four edges of the second mark are substantially identical.

15. A metrology system, comprising:
an imaging device, the imaging device configured for obtaining an image of a semiconductor device; and
a processor, the processor configured for:
identifying at least one metrology target from the image of the semiconductor device, wherein the at least one metrology target comprises:
a plurality of lines spaced equally apart from each other according to a pre-determined pitch distance;
a first mark defined by at least one edge parallel to the plurality of lines, the at least one edge of the first mark being configured to have at least one of: a periodically repetitive edge pattern having a first amplitude that is a multiple of the pre-determined pitch distance of the plurality of lines, a length that is a multiple of the pre-determined pitch distance of the plurality of lines, or a thickness that is a multiple of the pre-determined pitch distance of the plurality of lines;
a second mark defined by at least one edge parallel to the plurality of lines, the at least one edge of the second mark being configured to have at least one of: a periodically repetitive edge pattern having a second amplitude that is a multiple of the pre-determined pitch distance of the plurality of lines, a length that is a multiple of the pre-determined pitch distance of the plurality of lines, or a thickness that is a multiple of the pre-determined pitch distance of the plurality of lines; and
measuring target overlay of the semiconductor device based on alignment of the first mark and the second mark.

16. The metrology system of claim 15, wherein the plurality of lines spaced equally apart from each other forms an unresolved feature, and wherein the first mark and the second mark at least partially overlap with the plurality of lines.

17. The metrology system of claim 15, wherein the periodically repetitive edge pattern of the first mark and the periodically repetitive edge pattern of the second mark are identical.

18. The metrology system of claim 15, wherein the periodically repetitive patterns include at least one of: a sine pattern, a triangular pattern, or a rectangular pattern.

19. The metrology system of claim 15, wherein the first mark is a box mark defined by four edges, each of the four edges of the first mark having a length that is a multiple of the pitch distance, and each of the four edges of the first mark having a thickness that is a multiple of the pitch distance.

20. The metrology system of claim 19, wherein the second mark is a box mark defined by four edges, each of the four edges of the second mark having a length that is a multiple of the pitch distance, and each of the four edges of the second mark having a thickness that is a multiple of the pitch distance, wherein the second mark is defined within the first mark.

* * * * *